(12) United States Patent
Lai et al.

(10) Patent No.: US 9,219,009 B2
(45) Date of Patent: Dec. 22, 2015

(54) METHOD OF INTEGRATED CIRCUIT FABRICATION

(71) Applicant: Taiwan Semiconductor Manufacturing Company, Ltd., Hsin-Chu (TW)

(72) Inventors: Chia-Han Lai, Hsinchu County (TW); Chun-I Tsai, Hsinchu (TW); Wei-Jung Lin, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 18 days.

(21) Appl. No.: 14/136,823

(22) Filed: Dec. 20, 2013

(65) Prior Publication Data

US 2015/0179512 A1    Jun. 25, 2015

(51) Int. Cl.
*H01L 21/26* (2006.01)
*H01L 21/42* (2006.01)
*H01L 21/768* (2006.01)
*H01L 23/50* (2006.01)

(52) U.S. Cl.
CPC .... *H01L 21/76877* (2013.01); *H01L 21/76802* (2013.01); *H01L 23/50* (2013.01); *H01L 2924/0002* (2013.01)

(58) Field of Classification Search
CPC ...................... H01L 21/0228; H01L 21/02126; H01L 21/28556; H01L 21/02378; H01L 21/8238; H01L 21/28194; H01L 21/2807; H01L 21/76205; H01L 21/76224; H01L 27/1203; H01L 27/0923; H01L 29/4941; H01L 45/1616
USPC ......... 438/513, 311, 680, 682, 700, 197, 199, 438/683, 685, 686, 752, 753, 786, 474, 475, 438/678, 782; 257/396, 763, 760, 774, 257/E21.006, E21.055, 21.077, E21.091, 257/E21.126, E21.127, E21.129, E21.17, 257/E21.267, E21.278, E21.293, E21.277, 257/E21.32, E21.435, E21.545, E21.547, 257/E21.561, E21.577, E21.632
See application file for complete search history.

(56) References Cited

U.S. PATENT DOCUMENTS

| | | | |
|---|---|---|---|
| 6,218,301 B1 * | 4/2001 | Yoon et al. ................. 438/685 |
| 6,989,321 B2 | 1/2006 | Yamasaki et al. |
| 7,063,871 B2 | 6/2006 | Yamasaki et al. |
| 7,427,426 B2 | 9/2008 | Hatano et al. |
| 7,691,442 B2 * | 4/2010 | Gandikota et al. ......... 427/248.1 |
| 8,865,594 B2 * | 10/2014 | Lee et al. ................... 438/643 |
| 8,912,057 B1 * | 12/2014 | Deniz ........................ 438/154 |
| 8,975,142 B2 * | 3/2015 | Paul et al. .................. 438/283 |
| 2002/0190379 A1 | 12/2002 | Jian et al. |
| 2003/0008070 A1 | 1/2003 | Scutter et al. |

OTHER PUBLICATIONS

Do-Heyoung Kim et al., "Characteristics of Tungsten Carbide Films Prepared by Plasma-Assisted ALD Using Bis(tert-butylimido)bis(dimethylamido) tungsten", Journal of the Electrochemical Society, 150 (10, C740-C744 (2003).
H. Ono, T. Nakano and T. Ohta, "Diffusion Barrier Effects of Transition Metals for Cu/M/Si multilayers (M=Cr, Ti, Nb, Mo, Ra, W)", Appl. Phys. Lett. 64, 1511 (1994); doi: 10.1063/1.111875, 5 pages.

* cited by examiner

*Primary Examiner* — David Nhu
(74) *Attorney, Agent, or Firm* — Haynes and Boone, LLP

(57) ABSTRACT

A method of fabricating an integrated circuit (IC) is disclosed. The method includes providing a substrate having a conductive feature. A dielectric layer is formed over the substrate, having an opening to expose the conductive feature. A tungsten (W) capping layer is formed over the conductive feature in the opening without using fluorine-containing gases. A bulk W layer is formed over the W capping layer.

20 Claims, 5 Drawing Sheets

METHOD OF INTEGRATED CIRCUIT FABRICATION

BACKGROUND

The integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. One area is the wiring, or interconnects, between the transistors and other devices. Although existing methods of fabricating IC devices have been generally adequate for their intended purposes, they have not been entirely satisfactory in all respects. For example, challenges rise to develop improved dielectric and metal interconnection processes and structures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
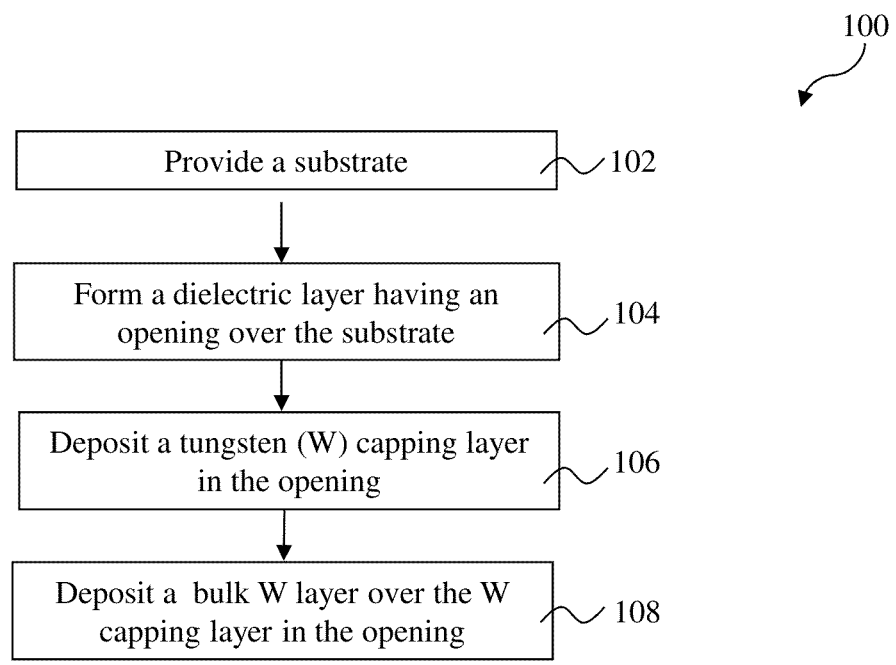
FIG. 1 is a flowchart of an example method for fabricating an integrated circuit (IC) constructed according to various aspects of the present disclosure.

FIG. 1 is a flowchart of one embodiment of a method 100 of fabricating one or more IC devices according to aspects of the present disclosure. The method 100 is discussed in detail below, with reference to an IC device 200 shown in FIGS. 2 to 6 for the sake of example.

Figure 2:
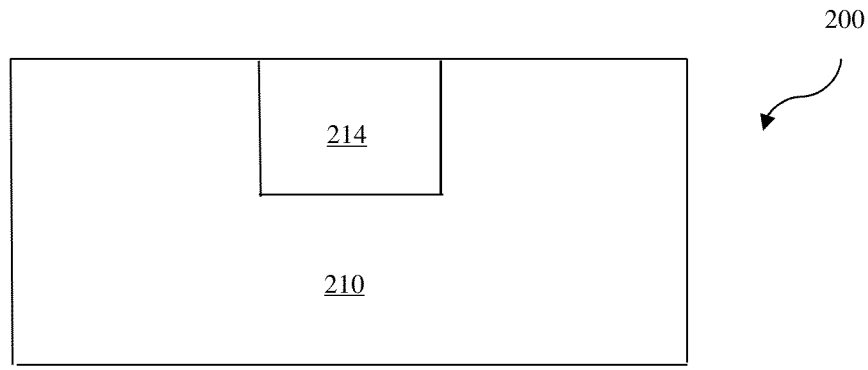
FIGS. 2 to 6 are cross-sectional views of an example IC device at fabrication stages constructed according to the method of FIG. 1.

Referring to FIGS. 1 and 2, the method 100 begins at step 102 by providing a semiconductor substrate 210. The semiconductor substrate 210 includes silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various IC devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The electrode layers may include a single layer or multi layers, such as metal layer, liner layer, wetting layer, and adhesion layer, formed by ALD, PVD, CVD, or other suitable process.

The substrate 210 may also include a plurality of inter-level dielectric (ILD) layers and conductive features integrated to form an interconnect structure configured to couple the various p-type and n-type doped regions and the other functional features (such as gate electrodes), resulting a functional integrated circuit. In one example, the substrate 210 may include a portion of the interconnect structure and the interconnect structure includes a multi-layer interconnect (MLI) structure and an ILD layer integrated with a MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

The substrate 210 also includes a conductive feature 214. The conductive feature 214 may include a doped region such as source and drain (S/D), a gate electrode, and/or a portion of the interconnect structure, such as a contact, metal via, or metal line. In one embodiment, the conductive features 214 include electrodes, capacitors, resistors or a portion of a resistor. The conductive features 214 may be formed by one or more procedures such as lithography, etching and deposition.

Figure 3:
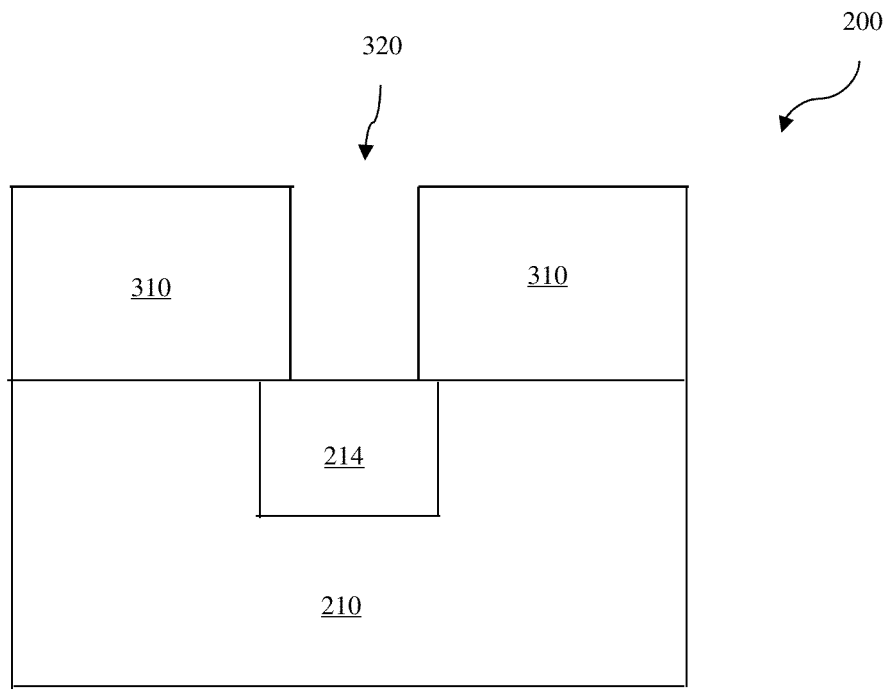

Referring to FIGS. 1 and 3, the method 100 proceeds to step 104 by forming a dielectric layer 310 having an opening 320 over the substrate 210, including over the conductive feature 214. The dielectric layer 310 includes silicon oxide, silicon nitride, oxynitride, a dielectric material having a dielectric constant (k) lower than thermal silicon oxide (therefore referred to as low-k dielectric material layer), or other suitable dielectric material layer. The dielectric layer 310 includes a single layer or multiple layers. The dielectric layer 310 may be deposited by chemical vapor deposition (CVD), atomic layer deposition (ALD) or spin-on coating.

The opening 320 may be formed by lithography patterning and etching processes. In the present embodiment, the opening 320 is formed such that it aligns to the conductive feature 214, and further such that at least a porting of the conductive feature 214 is exposed in the opening 320.

Figure 4:
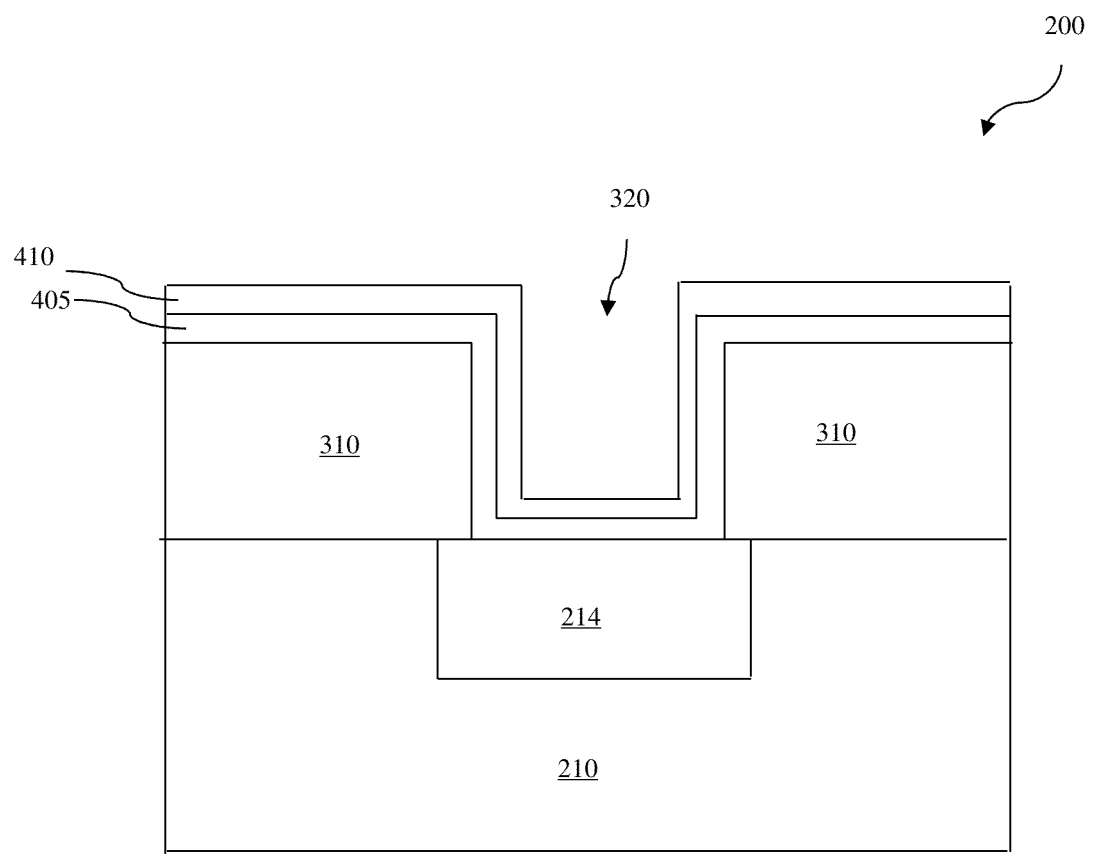

Referring to FIGS. 1 and 4, the method 100 proceeds to step 106 by depositing a thin tungsten (W) capping layer 410 in the opening 320, including sidewalls of the opening 320. In the present embodiment, the W capping layer 410 is deposited by a non-fluorine-containing process and therefore a composition of the W capping layer 410 has almost zero fluorine. The W capping layer 410 may be deposited by metal-organic chemical vapor deposition (MOCVD) with a W organic precursor such as $W(CO)_6$, $C_{10}H_{12}W$, $((CH_3)_3CN)_2W(N(CH_3)_2)_2$, $C_{12}H_{12}O_4W$, $C_{14}H_{20}W$, $(C_5H_4CH(CH_3)_2)_2WH_2$, $W(NCCH_3)_3(CO)_3$. Therefore, a composition of the W capping layer 410 may include W>50%, C>1%, O>1%, N>1% and H>1% (in atomic percent), according to respective W organic precursors and deposition conditions. Alternatively, the W capping layer 410 may be deposited by MOCVD with a W chloride precursor such as $WCl_5$ and $WCl_6$. Therefore a composition of the W capping layer 410 may include W>50%, Cl>0.1%, O>1% (in atomic percent), according to respective W chloride precursors and deposition conditions. In one embodiment, a thickness of the W capping layer 410C in a range from 5 Å to 500 Å.

In one embodiment, prior to depositing the W capping layer, a pre-silicide metal layer 405 is deposited over the conductive feature 214 (formed by a semiconductor material) in the opening 320. With the pre-silicide metal layer 405, a top portion of the conductive feature 214 (which contacts with the pre-silicide metal layer 405) may be formed in a silicide region during an anneal process, which will be described later. The pre-silicide metal layer 405 may include titanium (Ti). Alternatively, the pre-silicide metal layer 405 may include nickel (Ni), cobalt (Co), Iron (Fe), molybdenum (Mo), tantalum (Ta), zirconium (Zr), hafnium (Hf), niobium (Nb), platinum (Pt), iridium (Ir), palladium (Pd), rhodium (Rh), ruthenium (Ru), Lanthanides and also their mixing. The pre-silicide metal layer 405 may be deposited by PVD, CVD and or other suitable process.

Figure 5:
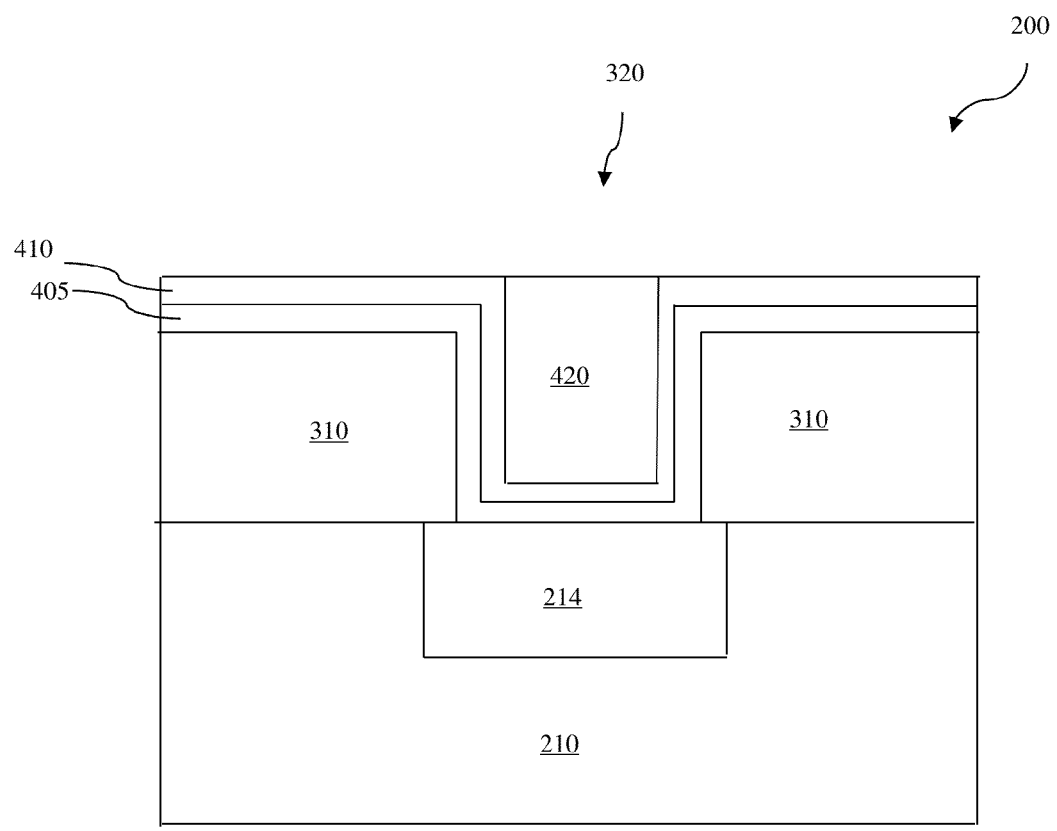

Referring to FIGS. 1 and 5, the method 100 proceeds to step 108 by depositing a bulk W layer 420 over the W capping layer 410 in the opening 320. In one embodiment, the bulk W layer 420 fully fills in the opening 320 and a chemical mechanical polishing (CMP) process is then applied to remove excessive bulk W layer 420 and the W capping layer 410 formed on the dielectric layer 310 and provides a planar top surface of the substrate 210. The bulk W layer 420 may be deposited by CVD, ALD, or other suitable technique. In one embodiment, the bulk W layer 420 is deposited by CVD with fluorine-containing gases, such as $WF_6$. During the deposition of the bulk W layer 420, the W capping layer 410 serves as a diffusion barrier layer for the bulk W layer 420. For example, the W capping layer 410 serves as a barrier layer to prevent $WF_6$ reacting with Ti pre-silicide layer 405 to form volatile $TiF_4$ (so-called W volcano) during ALD W nucleation and CVD W bulk deposition.

Figure 6:
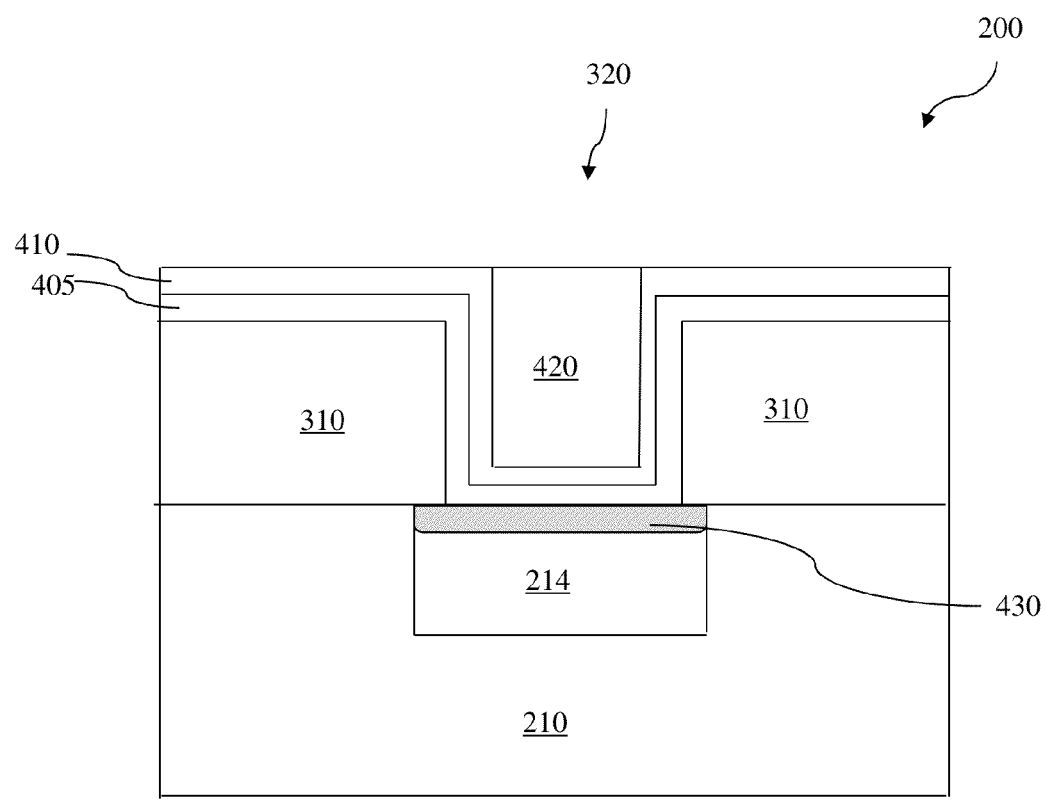

Additional steps can be provided before, during, and after the method 100, and some of the steps described can be replaced, eliminated, or moved around for additional embodiments of the method 100. In one embodiment, after the bulk W layer deposition, a high temperature annealing is applied to the semiconductor substrate 210 and the pre-silicide metal layer 405 reacts with the top portion of the conductive feature 214 (formed by semiconductor material) to form a silicide region 430 (as shown in FIG. 6). Additionally, another annealing process with a higher annealing temperature may be further implemented to turn the silicide features 430 into a phase of low resistivity. In this case, the W capping layer 410 may serve as a capping layer for the pre-silicide metal layer 405 to prevent oxygen diffusion-in to degrade contact resistance of the device.

In another embodiment, instead of applying an anneal process after the W layer 420 formation, the high temperature annealing is applied after the W capping layer 410 formation to form the silicide region 510. In this case, the W capping layer 410 may severs as a capping layer for the pre-silicide metal layer 405 to prevent oxygen diffusion-in to degrade contact resistance of the device as well.

The anneal process may include a rapid thermal anneal (RTA), a laser anneal, a furnace anneal, and/or a flash lamp anneal. In one embodiment, the anneal process may be conducted in an ambient with mixture of argon, nitrogen hydrogen and helium and in temperature ranging from about 200° C. to about 800° C.

Based on the above, the present disclosure offers methods for fabricating IC device. The method employs a W capping layer formed by MOCVD as a barrier layer for a subsequent bulk W layer formation. Meantime the W capping layer serves also as a capping layer for a pre-silicide metal layer during a silicide formation. With the MOCVD W capping layer, it demonstrates a reduction of contact resistance and a reduction of consumption of volume of the bulk W layer, which may reduce contact resistance further. The method provides a quite simple process integration.

The method provides a self-alignment nature for a metal etching process in an interconnection formation. The method also provides a formation of a metal feature with Al—C alloy, which demonstrates device reliability performance enhancement.

The present disclosure provides many different embodiments of fabricating an IC that provide one or more improvements over other existing approaches. In one embodiment, a method for fabricating an integrated circuit (IC) includes providing a substrate having a conductive feature. The method also includes forming a dielectric layer having an opening over the substrate. The opening aligns with the conductive feature and exposes at least a portion of the conductive feature. The method also includes forming a tungsten (W) capping layer over the conductive feature in the opening without using fluorine-containing gases and depositing a bulk W layer over the W capping layer.

In another embodiment, a method for fabricating an IC includes providing a substrate having a conductive feature, forming a dielectric layer having an opening over the substrate. The opening aligns with the conductive feature and exposes at least a portion of the conductive feature. The method also includes depositing a pre-silicide metal layer over the conductive feature in the opening, forming a non-fluorine-containing tungsten (W) capping layer over the pre-silicide metal layer in the opening, depositing a bulk W layer over the W capping layer and applying an annealing to form a silicide region in the conductive feature.

In yet another embodiment, an IC includes a substrate, a conductive feature over the substrate, a dielectric layer over the substrate. The dielectric layer has an opening to expose at least a portion of the conductive feature. The IC also includes a tungsten (W) capping layer over the conductive feature in the opening, including covering sidewalls of the opening. The W capping layer is formed by metal-organic chemical vapor deposition (MOCVD). The IC also includes a bulk W layer over the W capping layer and filling in the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an integrated circuit (IC), the method comprising:
   providing a substrate having a conductive feature;
   forming a dielectric layer having an opening over the substrate, wherein the opening aligns with the conductive feature and exposes at least a portion of the conductive feature;
   forming a tungsten (W) capping layer over the conductive feature in the opening without using fluorine-containing gases; and
   depositing a bulk W layer over the W capping layer.

2. The method of claim 1, wherein the W capping layer is formed by metal-organic chemical vapor deposition (MOCVD) with a W organic precursor.

3. The method of claim 1, wherein the W capping layer is formed by metal-organic chemical vapor deposition (MOCVD) with a W chloride precursor.

4. The method of claim 1, wherein the conductive feature includes a semiconductor material.

5. The method of claim 4, wherein prior to forming the W capping layer, a pre-silicide layer is formed over the conductive feature.

6. The method of claim 5, wherein the forming the pre-silicide layer includes depositing a titanium layer over the conductive feature in the opening.

7. The method of claim 6, wherein an anneal process is applied to the W capping layer and the conductive feature to form a silicide region in the conductive feature.

8. The method of claim 7, wherein the anneal process is applied after the forming the W capping layer.

9. The method of claim 7, wherein the anneal process is applied after the depositing the bulk W layer.

10. A method for fabricating an integrated circuit (IC), the method comprising:
    providing a substrate having a conductive feature;
    forming a dielectric layer having an opening over the substrate, wherein the opening aligns with the conductive feature and exposes at least a portion of the conductive feature;
    depositing a pre-silicide metal layer over the conductive feature in the opening;
    forming a non-fluorine-containing tungsten (W) capping layer over the pre-silicide metal layer in the opening;
    depositing a bulk W layer over the W capping layer; and
    after depositing the pre-silicide metal layer and the bulk W layer, annealing to form a silicide region in the conductive feature.

11. The method of claim 10, wherein the non-fluorine-containing W capping layer is formed by metal-organic chemical vapor deposition (MOCVD) with a W organic precursor.

12. The method of claim 10, wherein the non-fluorine-containing W capping layer is formed by MOCVD with metal-organic chemical vapor deposition (MOCVD) with a W chloride precursor.

13. The method of claim 10, wherein the forming the pre-silicide layer includes depositing a titanium layer over the conductive feature in the opening.

14. The method of claim 10, wherein the anneal process is applied after the forming the non-fluorine-containing W capping layer.

15. The method of claim 10, wherein the anneal process is applied after the depositing the bulk W layer.

16. An integrated circuit (IC), comprising:
    a substrate;
    a conductive feature over the substrate;
    a dielectric layer over the substrate, having an opening to expose at least a portion of the conductive feature;
    a tungsten (W) capping layer formed by metal-organic chemical vapor deposition (MOCVD), over the conductive feature in the opening, including covering sidewalls of the opening; and
    a bulk W layer over the W capping layer and filling in the opening, wherein a composition of W capping layer includes:
    more than fifty atomic percent (50%) of W;
    more than one atomic percent (1%) of carbon;
    more than one atomic percent (1%) of oxygen;
    more than one atomic percent (1%) of nitrogen; and
    more than one atomic percent (1%) of hydrogen.

17. An integrated circuit (IC) comprising:
a substrate;
a conductive feature over the substrate;
a dielectric layer over the substrate, having an opening to expose at least a portion of the conductive feature;
a tungsten (W) capping layer formed by metal-organic chemical vapor deposition (MOCVD), over the conductive feature in the opening, including covering sidewalls of the opening; and
a bulk W layer over the W capping layer and filling in the opening, wherein a composition of chloride in the W capping layer is more than one atomic percent (1%).

18. The IC of claim 17, further comprising:
a metal layer between the conductive feature and the W capping layer in the opening; and
a silicide region as a top portion of the conductive feature under the metal layer.

19. The IC of claim 18, wherein the metal layer includes one or more materials from the group consisting of titanium (Ti), nickel (Ni), cobalt (Co), iron (Fe), molybdenum (Mo), tantalum (Ta), zirconium (Zr), hafnium (Hf), niobium (Nb), platinum (Pt), iridium (Ir), palladium (Pd), rhodium (Rh), ruthenium (Ru), lanthanides and their mixing.

20. The IC of claim 16, further comprising a silicide feature disposed between the W capping layer and the conductive feature over the substrate.

* * * * *